(12) United States Patent
Goerlach

(10) Patent No.: US 10,784,255 B2
(45) Date of Patent: Sep. 22, 2020

(54) DIODE HAVING A PLATE-SHAPED SEMICONDUCTOR ELEMENT

(71) Applicant: Robert Bosch GmbH, Stuttgart (DE)

(72) Inventor: Alfred Goerlach, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 50 days.

(21) Appl. No.: 15/965,050

(22) Filed: Apr. 27, 2018

(65) Prior Publication Data

US 2018/0247934 A1    Aug. 30, 2018

Related U.S. Application Data

(62) Division of application No. 14/744,358, filed on Jun. 19, 2015, now abandoned.

(30) Foreign Application Priority Data

Jun. 27, 2014   (DE) .................. 10 2014 212 455

(51) Int. Cl.
| | | |
|---|---|---|
| *H01L 27/06* | (2006.01) | |
| *H01L 29/78* | (2006.01) | |
| *H01L 27/08* | (2006.01) | |
| *H01L 23/00* | (2006.01) | |
| *H01L 29/861* | (2006.01) | |
| *H01L 23/051* | (2006.01) | |
| *H01L 27/07* | (2006.01) | |

(52) U.S. Cl.
CPC ........ *H01L 27/0629* (2013.01); *H01L 23/051* (2013.01); *H01L 24/01* (2013.01); *H01L 27/0727* (2013.01); *H01L 27/0814* (2013.01); *H01L 29/78* (2013.01); *H01L 29/8611* (2013.01)

(58) Field of Classification Search
CPC ............... H01L 29/861; H01L 29/0619; H01L 27/0629; H01L 27/0676; H01L 29/8611
See application file for complete search history.

(56) References Cited

U.S. PATENT DOCUMENTS

| | | | |
|---|---|---|---|
| 6,177,713 B1 | 1/2001 | Aono | |
| 6,703,707 B1 * | 3/2004 | Mamitsu | ............... H01L 23/051 |
| | | | 257/718 |

(Continued)

FOREIGN PATENT DOCUMENTS

| | | |
|---|---|---|
| CN | 1933201 A | 3/2007 |
| DE | 19549202 | 7/1997 |

*Primary Examiner* — Samuel A Gebremariam
*Assistant Examiner* — Jonas T Beardsley
(74) *Attorney, Agent, or Firm* — Norton Rose Fulbright US LLP; Gerard Messina

(57) ABSTRACT

A diode is provided having a plate-shaped semiconductor element that includes a first side and a second side, the first side being connected by a first connecting layer to a first metallic contact and the second side being connected by a second connecting layer to a second metallic contact, the first side having a diode element in a middle area and having a further diode element in an edge area of the first side, which has crystal defects as a result of a separating process of the plate-shaped semiconductor element, the first connecting layer only establishing an electrical contact to the diode element and not to the further diode element and, on the first side, the further diode element having an exposed contact, which may be electrically contacted by the first connecting layer.

28 Claims, 3 Drawing Sheets

(56) References Cited

U.S. PATENT DOCUMENTS

| | | | |
|---|---|---|---|
| 7,193,246 B1 | 3/2007 | Tanizawa | |
| 2002/0140059 A1 | 10/2002 | Yamazaki | |
| 2004/0099929 A1* | 5/2004 | Goerlach | H01L 29/861 |
| | | | 257/653 |
| 2007/0138596 A1* | 6/2007 | Kitamura | H01L 23/051 |
| | | | 257/565 |
| 2008/0132048 A1* | 6/2008 | Barthelmess | H01L 21/263 |
| | | | 438/530 |
| 2011/0291223 A1* | 12/2011 | Nakamura | H01L 23/3171 |
| | | | 257/493 |
| 2012/0313212 A1 | 12/2012 | Sugawara | |
| 2012/0319163 A1* | 12/2012 | Tsuzuki | H01L 21/263 |
| | | | 257/140 |
| 2016/0315140 A1* | 10/2016 | Iwasaki | H01L 29/32 |

\* cited by examiner

DIODE HAVING A PLATE-SHAPED SEMICONDUCTOR ELEMENT

CROSS REFERENCE TO RELATED APPLICATIONS

The present application is a divisional application of U.S. patent application Ser. No. 14/744,358, filed Jun. 19, 2015, which claims priority to and the benefit of German Patent Application No. 10 2014 212 455.7, which was filed in Germany on Jun. 27, 2014, the contents of each of which are hereby incorporated by reference in their entireties.

FIELD OF THE INVENTION

The present invention is directed to a diode having a plate-shaped semiconductor element.

BACKGROUND INFORMATION

Diodes having a plate-shaped semiconductor element, which is connected by a first and second connecting layer to a first and second metallic contact, are already known from German Published Patent Application No. 195 49 202.

SUMMARY

The diode according to the present invention has the advantage in relation thereto that the diode element is contacted by the first connecting layer, and a further diode element, which is situated in an edge region which has crystal defects, is not contacted. In the case of correct contacting, current therefore exclusively flows via the diode element and not via the further diode element. If contacting of the further diode element occurs as a result of a flawed arrangement of the first connecting layer, this is thus detectable by a simple electrical measurement at the diode. It may therefore be established by a simple electrical measurement at the diode whether the first connecting layer is embodied correctly between the first metallic contact and the first side of the semiconductor element. Because of the arrangement of the further diode in a region having crystal defects, it may be ascertained by a simple measurement of the blocking current whether this further diode is also electrically connected by the first connecting layer to the first metallic contact. The manufacturing process may thus be monitored or thermally related travel of the connecting layer may be detected. The quality of the diodes may thus be improved.

The contacting of the further diode takes place particularly simply in that, in the event of a flawed arrangement of the first connecting layer, the exposed contact of the further diode element is electrically contacted. Such a flawed arrangement may arise in a faulty manufacturing process or also during operation of the diode as a result of mechanical stress as a result of the different coefficients of thermal expansion of the participating materials. The semiconductor element is particularly simply cut out of a large plate, which is spatially very much larger, by sawing in a separating process. Crystal defects are automatically introduced into an edge region of the semiconductor element by the sawing process. A variety of different diodes, for example, p-n diode, a Schottky diode, planar or trenched MOS field effect transistors, or an MOS field effect transistor in which gate, body, and source regions are short-circuited with one another, come into consideration for the first diode element. The further diode is particularly simply designed as a p-n diode. Both a solder, in particular a lead-free solder, or also a sintered layer made of metal particles may be used as the connecting layer. The exposed contacts preferably have metal layers, since contacting of the first connecting layer with the exposed contacts of the further diode is thus simplified. These metal structures may be implemented in particular as ring structures, whereby further thermal creep of the connecting layer is prevented. To reliably ensure, by way of a simple measurement, whether the first connecting layer is correctly embodied between the first metallic contact and the first side of the semiconductor element, the diode and the further diode are to have a lateral distance from one another which is greater than the width of the space charge zone, which propagates from the diode in the blocking case, so that the space charge zone of the diode does not extend up to the further diode element. The blocking case is understood here as the extension of the space charge zone in the event of the maximum applicable blocking voltage. The maximum applicable blocking voltage is limited to a maximum value by a breakthrough of the diode in the middle region of the semiconductor element due to the avalanche effect. Also in this case (or up to a somewhat higher voltage), the space charge zone is not to extend up to the further diode in the edge region. Alternatively, a circumferential highly doped semiconductor layer having inverted polarity may be located between the two diodes at the semiconductor surface, which delimits the extension of the space charge zone.

DETAILED DESCRIPTION

Figure 1:
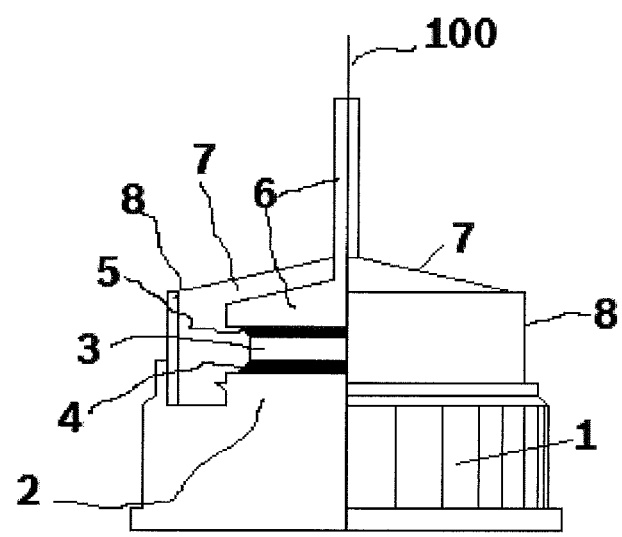
FIG. 1 shows a side view/sectional view of a diode according to the related art.

In FIG. 1, a cross section is shown on the left side of axis 100 and an external view is shown on the right side of axis 100 of a diode for a generator, in particular for a generator in a motor vehicle. This diode has a press-in base 1, which is provided on its outer side with so-called knurling, i.e., score marks. Press-in base 1 is pressed into a corresponding opening of a metallic rectifier arrangement using this knurling. A particularly close formfitting connection of press-in base 1 to the rectifier arrangement takes place due to the score marks of the knurling, whereby very good electrical contacting and very good dissipation of heat are ensured. As may be seen in the cross section, press-in base 1 also has a mounting base 2, on which actual semiconductor element 3 is mounted. This metallic base 2 therefore represents a metallic contact 2 for semiconductor element 3. Semiconductor element 3 is connected to metallic contact 2 by an electrically conductive connecting layer 4. Semiconductor element 3 is also connected by an electrically conductive connecting layer 5 to metallic contact 6. For the further discussion, metallic contact 6 is referred to as the first metallic contact, connecting layer 5 is referred to as the first connecting layer, connecting layer 4 is referred to as the second connecting layer, and metallic contact 2 is referred to as the second contact. Furthermore, semiconductor element 3 may also have thin superficial contacting layers, which are situated between semiconductor element 3 and first connecting layer 5 and second connecting layer 4. For example, a layer sequence made of Cr, $NiV_7$, and Ag may be used for the connection of semiconductor element 3 to first connecting layer 5 and second connecting layer 4. Furthermore, the entirety of first metallic contact 6, semiconductor component 3, and second metallic contact 2 is completely enveloped by a potting compound 7. Potting compound 7 is an insulating plastic compound, which has the task of absorbing a part of the mechanical forces which act on first contact 6, first connecting layer 5 of semiconductor element 3, second connecting layer 4, and second metallic contact 2. As an aid for the potting, a plastic ring 8 is also provided, which is used during the mounting as a potting sleeve for plastic compound 7. An epoxy filled with quartz grains or another high-temperature-resistant plastic may be used as plastic compound 7, for example. A material having good electrical conductivity and a material having good heat conductivity, for example, copper, is preferably used as the material for first contact 6 and/or second contact 2 and/or press-in base 1. To ensure a good surface quality, these copper materials may be provided with a thin superficial nickel layer. Such a diode element, as shown in FIG. 1, is already known, for example, from DE 195 49 202.

Either a solder or a sintering material may be used for first connecting layer 5 and second connecting layer 4. For the manufacturing, a solder is typically placed as a small solder plate between semiconductor element 3 and the first and second electrical contacts and then melted by a temperature treatment. The molten solder then wets (possibly with the aid of a flux) the surface of semiconductor element 3 and electrical contacts 2, 6 and produces an electrical and mechanical connection between semiconductor element 3 and metallic contacts 2, 6 after the solidification of the solder. For a sintering material as connecting layer 4, 5, initially a pasty material made of a plastic having metal particles is applied to semiconductor element 3 and/or the metallic contacts. Printing or inlaying appropriate films is suitable for this purpose. The plastic is then converted into a gaseous state by a temperature treatment and the metal particles are bonded to one another and to the surfaces of semiconductor element 3 and metallic contacts 2, 6 by a sintering process. An electrical and mechanical connection is thus provided between semiconductor element 3 and metallic contacts 2, 6. Misalignment may occur during this manufacturing method, i.e., the arrangement of the small solder plate or the molten solder or the sintering material may not correspond to the intended position. In particular, the connecting layer may not only reach into an intended middle region of semiconductor element 3, but rather also into an unintended edge region due to such misalignment.

During operation of the diodes in the forward direction, a forward voltage UF drops thereon, which results, at room temperature and current densities of 500 A/cm$^2$, in the case of p-n diodes in a value of approximately 1 V, and in the case of high-efficiency diodes in approximately 0.6 V-0.8 V. The power drop linked thereto is converted into heat and is essentially dissipated via the press-in base and the rectifier arrangement of the generator. As a result, barrier layer temperature Tj of the diodes increases. Thus, in the case of high generator currents and, in addition, high ambient temperatures, barrier layer temperatures Tj of up to 240° C. are measured at the diode. In practice, the diodes are subjected to many temperature cycles. For example, 3000 temperature cycles are to be withstood with a failure rate less than 1%. The situation is exacerbated by the increased use of modern start-stop or recuperation systems, in the case of which approximately 0.2-2 million temperature cycles of approximately 40° C. to 80° C., which are superimposed on the mean diode temperature, may additionally occur.

Of course, connecting layers 4, 5 used cannot melt at the high temperatures. If a solder is used for connecting layers 4, 5, a solder is thus used, melting temperature Ts of which is preferable as high as possible above maximum occurring barrier layer temperature Tj. Thus, solders having a high lead content have generally been used up to this point, solidus temperature Ts of which is greater than 300° C. Such diodes are known, for example, from DE 19549202.

The materials which are combined in the diode, silicon, connecting layers 4, 5 having a lead-containing solder in particular, and copper, have large differences in the physical material properties. Thus, for example, coefficients of expansion and moduli of elasticity are very different. In the event of temperature changes, high mechanical tensions therefore occur. The mechanical tension arising in connecting layers 4,5 during the temperature variations rapidly reach and exceed the elasticity limit of connecting layers 4, 5, i.e., connecting layers 4, 5 begin to deform plastically. A procedure occurs, which is referred to as creep. Connecting layers 4, 5 swell up out of their original positions in the course of time and creep into the area between copper or chip sides (2, 6 or 3, respectively) and plastic layer 7. The creep of connecting layers 4, 5 finally results in short-circuits. The described effect also fundamentally occurs in the case of lead-free soft solders.

In addition, errors may occur during the mounting and the soldering of base (1), small solder plate (4, 5), semiconductor chip (3), and copper wire. For example, the solder may not be correctly placed during the mounting, or may run out during soldering. In the case of joining methods which do not use soft solder—for example, in the case of low-temperature silver sintering (NTV)—the joining layer may also be incorrectly placed during the construction, inter alia. The silver layer may be located too close to the chip edge or may even protrude beyond the chip edge, for example.

Figure 2:
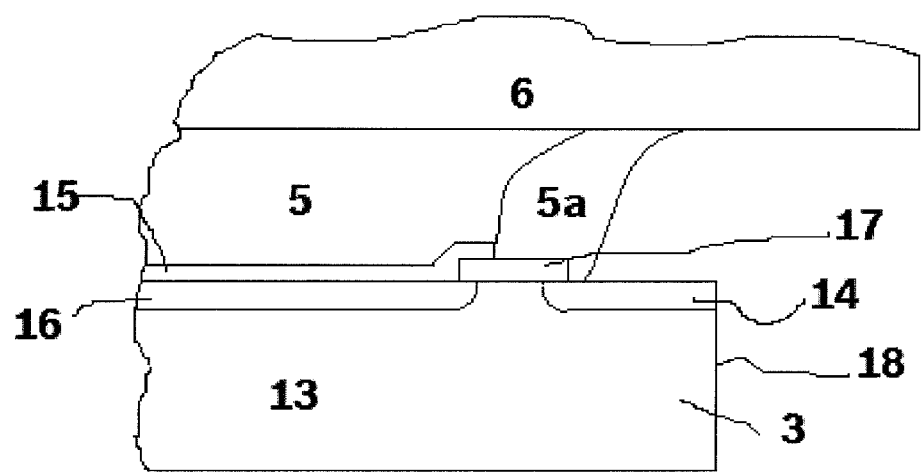
FIG. 2 shows a first exemplary embodiment.

A first exemplary embodiment of the present invention is shown in FIG. 2. A detail is shown in FIG. 2, in which only semiconductor element 3, first connecting layer 5, and first metallic contact 6 are shown. Second connecting layer 4 and second metallic contact 2 are not shown in this view, since they are not significant for comprehending the present invention. In FIG. 2, the internal structure of semiconductor element 3 is also shown in particular. Semiconductor element 3 is implemented as a plate-shaped semiconductor element, which has a first side, which faces toward first metallic contact 6. Furthermore, plate-shaped semiconductor element 3 has a second side, which faces toward second connecting layer 4 or second metallic contact 2. Second metal plating 2 and second connecting layer 4 are not shown in FIG. 2.

On the first side of plate-shaped semiconductor element 3, which is referred to as the upper side hereafter, a p-doping 16 is provided in a middle area and a p-doping 14 is provided in an edge area. P-doping 16 forms, together with n-doping 13 of plate-shaped semiconductor element 3, a p-n diode, which represents the actual diode for the rectifier. P-doping 14, which is situated in the edge area, also forms, with n-material 13 of plate-shaped semiconductor element 3, a further diode, which is situated in the edge area. The upper side of semiconductor element 3 is provided in an area between p-doping 16 and p-doping 14 with a dielectric layer 17, for example, a silicon oxide layer. A contact metal plating 15 is provided on p-doping 16, which includes, for example, the above-described layer sequence of chromium, nickel, and silver and establishes a good ohmic contact to p-doping 16. Furthermore, this metal plating layer 15 establishes a good electrical contact to connecting layer 5. A good ohmic contact between metal contact 6 and the p-n diode, formed from p-doping 16 and n-material 13, is established by this metal plating layer 15 and connecting layer 5. P-doping 16 is provided in a middle area, i.e., this p-doping does not reach the lateral edge of plate-shaped semiconductor element 3 at any point. P-doping 14 completely encloses p-doping 16, i.e., the entire edge area around the middle area is provided with a p-doping 14 and completely encloses the middle area.

Edge area 18 of plate-shaped semiconductor element 3 is typically produced in that a plurality of semiconductor elements 3 are manufactured on a large plate, in particular a silicon wafer, and then this large plate is cut into a plurality of individual semiconductor elements 3 by a sawing process. A plurality of mechanical micro-cracks is introduced by this sawing process into the edge area, i.e., in lateral edge 18, which results in a change of the electrical semiconductor properties of the material. In particular, such micro-cracks also extend into the area in which the further diodes, formed by p-doping 14 and n-doping 13, extend. The electrical properties of this further diode therefore differ significantly from the electrical properties of the diode which are produced by p-doping 16 and n-silicon 13. For an approximately 20 $mm^3$ diode in the middle area having a breakthrough voltage in the range of 20 V, the blocking current, i.e., the current which flows upon the application of a blocking voltage for the diode in the middle area (p-doping 16-n-doping 13), is generally less than 100 nA. The blocking current of the further diode in the edge area (p-doping 14-n-doping 13), in contrast, is in the order of magnitude of 10 to 100 μA. Therefore, by measuring the blocking current, it may be determined whether only the diode in the middle area (p-doping 16-n-doping 13) or also the diode in the edge area (p-doping 14-n-doping 13) was contacted by connecting layer 5.

In FIG. 2, a correct arrangement of connecting layer 5 in relation to the diode in the middle area (16-13) is shown by reference numeral 5. A flawed arrangement of connecting layer 5 in relation to plate-shaped semiconductor element 3 is shown by reference numeral 5a, in such a way that electrical contacting of the exposed contact of p-doping 14 also takes place via connecting layer 5a, which is now incorrectly situated. Due to incorrectly situated connecting layer 5a, the upper side of p-doping 14 and therefore the exposed electrical contact of the further diode in the edge area is therefore contacted. A current flow may therefore also take place via the further diode in the edge area (14-13), which has an influence on the electrical properties of the overall semiconductor element or the diode. If a current is applied in the forward direction to first metallic contact 6 and second metallic contact 2, the current will thus predominantly flow via the diode in the middle area (16-13) and an increased current of the further diode in the edge area (14-13) through the crystal defects will not have further influence. However, if a voltage is applied in the blocking direction, the current flow via the diode in the middle area (16-13) will only be slight, while the current flow via the further diode in the edge area (14-13) will have significantly greater influence than the current flow via the diode in the middle area (16-13). A possibility is thus provided of determining, by applying a blocking voltage, whether the first connecting layer only contacts the diode in the middle area (16-13) or also contacts the further diode in the edge area (14-13). To reliably ensure by a simple measurement whether the first connecting layer is correctly embodied between the first metallic contact and the first side of the semiconductor element, the diode and the further diode are to have a lateral distance from one another which is greater than the range of the space charge zone propagating from the diode in case of blocking, so that the space charge zone of the diode does not extend up to the further diode element. The blocking case is understood here as the extension of the space charge zone in the case of the maximum applicable blocking voltage. The maximum applicable blocking voltage is limited to a maximum value by a breakthrough of the diode in the middle area of the semiconductor element due to the avalanche effect. Also in this case (or up to a somewhat higher voltage), the space charge zone is also not to extend up to the further diode in the edge area. Alternatively, a circumferential, highly-doped semiconductor layer having inverted polarity, which delimits the extension of the space charge zone, may also be located between the two diodes on the semiconductor surface.

Figure 3:
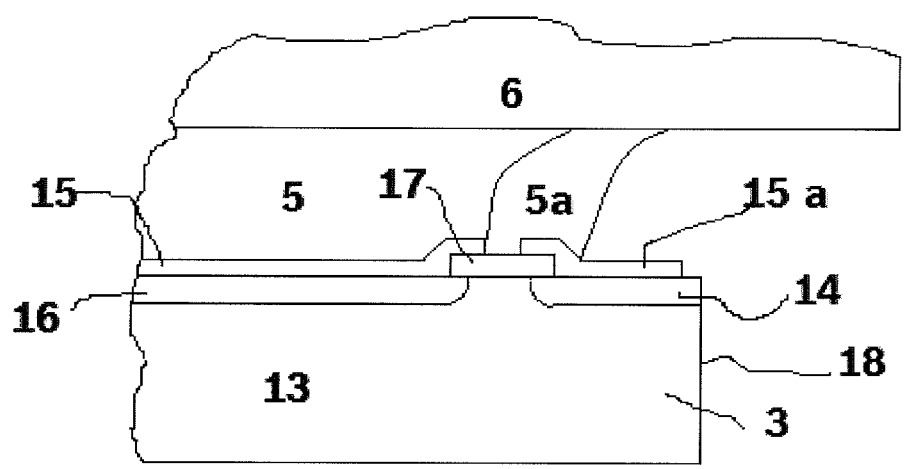
FIG. 3 shows a second exemplary embodiment.

FIG. 3 shows another exemplary embodiment of the present invention. The specific embodiment in FIG. 3 essentially corresponds to the specific embodiment according to FIG. 2, and reference numerals 3, 5, 6, 13, 14, 15, 16, 17, and 18 also identify the same objects in FIG. 3 as in FIG. 2. However, in contrast to FIG. 2, a further metal plating 15a is provided, which is constructed with regard to the materials precisely like metal plating 15. However, metal plating 15a is situated in the edge area above further diode 14-13, so that the exposed contact of this further diode is now no longer formed by the surface of p-doping 14, but rather by metal plating 15a. Particularly simple contacting of the further diode is ensured by this measure, since an electrical contact of incorrectly situated connecting layer 5a to metal plating layer 15a is ensured. It is thus ensured that contacting of incorrectly situated connecting layer 5a to further diode 14-13 is ensured. The recognition in principle of an incorrectly situated connecting layer 5 is thus further improved.

Figure 4:
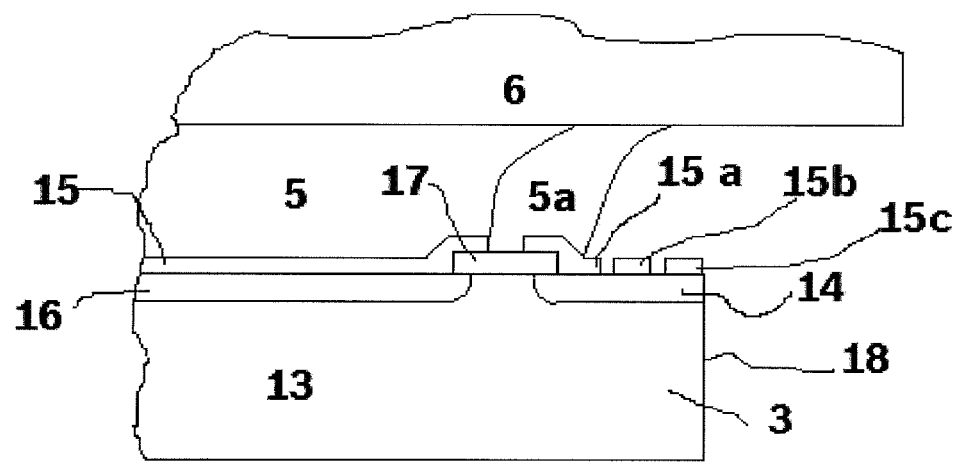
FIG. 4 shows a third exemplary embodiment.

FIG. 4 shows another exemplary embodiment of the diode according to the present invention. Reference numerals 3, 5, 6, 13, 14, 15, 16, 17, 18, 5a, and 15a again represent the same objects as in FIGS. 2 and 3. In contrast to FIGS. 2 and 3, however, a plurality of different metal platings 15a, 15b, and 15c are provided in the edge area, which are each situated in the edge area and each completely enclose the middle area in a ring. These metal layers 15a, 15b, and 15c are again metal contacts of further diode 14-13 in the edge area. Since these individual metal platings are separate from one another, however, and an area is provided in each case between individual metal platings 15a, 15b, 15c, in which no metal is provided, a further propagation of flawed connecting layer 5a is prevented. Specifically, it has been shown that in the event of thermally related creep of metal layer 5a, surfaces which are already covered with metal are very easily covered, and then at the end of such a superficial metal plating 15a, 15b, 15c, further creep is prevented. Therefore, further thermally related creep of connecting layer 5 is prevented by the arrangement as the multiple ring type structures of metal platings 15a, 15b, 15c. Alternatively, additional dielectric layers (similarly to layer 17) may also be located between metal layers 15a, 15b, and 15c.

Figure 5:
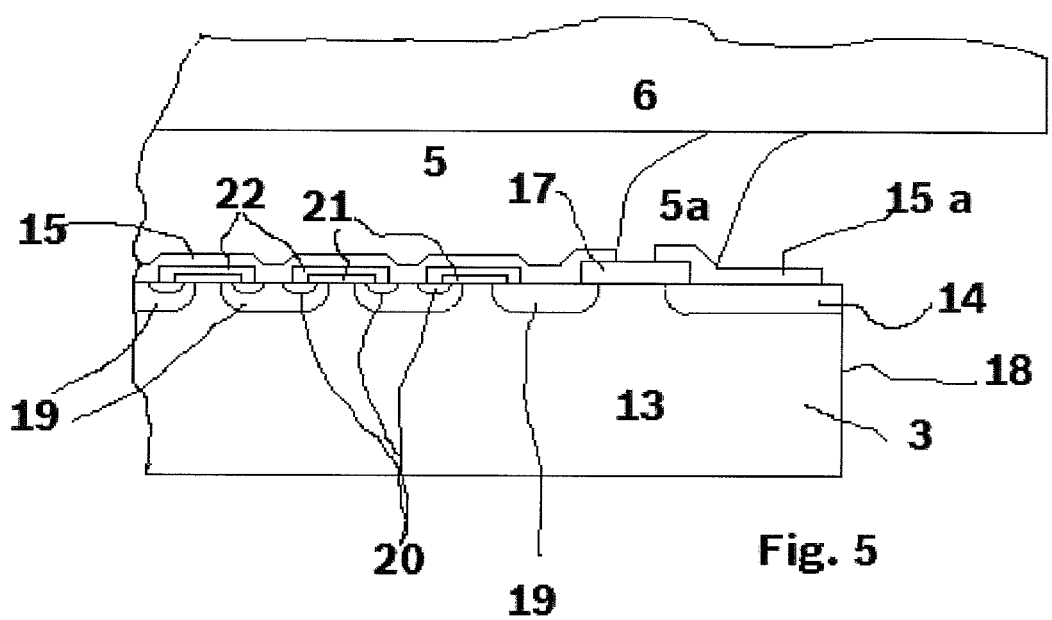
FIG. 5 shows a fourth exemplary embodiment of the diode according to the present invention.

FIG. 5 shows another exemplary embodiment of the present invention. Reference numerals 3, 5, 6, 13, 14, 15, 15a, 17, 5a, and 18 again identify the same objects as in FIG. 3. In contrast to FIG. 3, however, a continuous p-doping 16, which forms a first p-n diode in a middle area, is not provided. Instead, a plurality of individual p-areas 19 is provided. In these p-areas 19, flat, highly n-doped areas 20 are introduced, which form the source zones of MOS transistors. A thin gate oxide 21 is then provided on the upper side, which extends on the upper side of semiconductor element 3 from superficially exposed areas 13 via p-doped areas 19 up to strongly n-doped source areas 20. Thin gate oxide 21 is then covered with an n-doped polysilicon gate 22, which is in turn completely covered by metal plating 15. An MOS transistor is thus provided in the middle area of semiconductor element 3, in which the gate, body region, and source region are electrically short-circuited with one another. Such a component also behaves like a diode having a very low forward voltage and also only has a very small current flow in the blocking direction. In the case of such a component according to FIG. 2, it may therefore also be established by measuring a blocking current whether an incorrect arrangement of connecting layer 5 or 5a has occurred. The MOS transistors in FIG. 5 may also be embodied in other variations corresponding to the related art.

What is claimed is:

1. A diode arrangement, comprising:
    a plate-shaped semiconductor element;
    a first metallic contact arranged above the plate-shaped semiconductor element;
    a first connecting layer that extends from at least a portion of a first side of the plate-shaped semiconductor element to the first metallic contact and via which the first side of the plate-shaped semiconductor element is connected to the first metallic contact;
    a second metallic contact arranged below the plate-shaped semiconductor element; and
    a second connecting layer arranged between a second side of the plate-shaped semiconductor element and the second metallic contact and via which the second side of the plate-shaped semiconductor element is connected to the second metallic contact;
    wherein:
        the plate-shaped semiconductor element includes a first diode in a middle area of the first side and a second diode in an edge area of the first side, the edge area and the second diode completely encircling the middle area;
        the edge area, including the second diode, includes a higher concentration of crystal defects than the middle area including the first diode;
        the first metallic contact extends laterally so that it is positioned over both the first diode in the middle area and at least a portion of the second diode in the edge area;
        an electrical connection is established between the first metallic contact and the plate-shaped semiconductor element by an extension of the first connecting layer in a first direction from the first metallic contact towards the plate-shaped semiconductor element;
        a portion of the first connecting layer is arranged over the first diode; on the first side:
            the second diode includes an electrical contact, at least a part of a top surface of which is not contacted by the first connecting layer, so that the electrical contact is therefore exposed; and
            the first diode includes an electrical contact, a top surface of which is contacted by the first connecting layer; and
        the diode arrangement is structured such that a current flow of the diode arrangement responsive to application of a blocking voltage to the diode arrangement is, of the first and second diodes, (a) influencable by only the first diode and not the second diode if the first connecting layer is arranged such that no portion of the first connecting layer contacts the electrical contact of the second diode in the edge area, so that an electrical connection between the first metallic contact and the electrical contact of the second diode is not established independent of the first diode and (b) strongly influencable by the second diode if the first connecting layer contacts the electrical contact of the second diode, so that whether the first connecting layer presently contacts the electrical contact of the second diode is measurable by application of the blocking voltage to the diode arrangement.

2. The diode arrangement of claim 1, wherein the first connecting layer is initially arranged such that, while the first metallic contact is arranged over the top surface of the second diode in the edge area, the electrical contact of the second diode is electrically contactable by the first connecting layer in the edge area but no portion of the first connecting layer contacts the electrical contact of the second diode in the edge area, so that an electrical connection between the first metallic contact and the electrical contact of the second diode is not established independent of the first diode, but the first connecting layer can laterally creep to contact the electrical contact of the second diode.

3. The diode arrangement of claim 1, wherein the first connecting layer is initially arranged such that, while the first metallic contact is arranged over the top surface of the second diode in the edge area, the electrical contact of the second diode is electrically contactable by the first connecting layer in the edge area but no portion of the first connecting layer contacts the electrical contact of the second diode in the edge area, so that an electrical connection between the first metallic contact and the electrical contact of the second diode is not established independent of the first diode, but the first connecting layer can, under thermal influence, laterally creep to contact the electrical contact of the second diode.

4. The diode arrangement of claim 1, wherein the first connecting layer is arranged, due to a misalignment during fabrication, such that the first connecting layer contacts the electrical contact of the second diode in the edge area, so that an electrical connection between the first metallic contact and the electrical contact of the second diode is established independent of the first diode.

5. The diode arrangement of claim 1, further comprising a continuous extension of potting compound directly contacting, at least circumferentially surrounding, and in which are embedded, at least a portion of each of the plate-shaped semiconductor element, the first metallic contact, the first connecting layer, the second metallic contact, and the second connecting layer, with the potting compound directly contacting a top surface of the second diode.

6. The diode arrangement of claim 1, wherein the first connecting layer is arranged entirely below the first metallic contact and entirely above the plate-shaped semiconductor, and, within each of at least one first plane, at least a portion of the first connecting layer extends laterally from (a) over a first position in which a part of the first diode is located and no part of the second diode is located to (b) over a second position in which a part of the second diode is located and no part of the first diode is located.

7. The diode arrangement of claim 1, wherein the first connecting layer and the second diode are configured to be electrically connected to each other with a lateral shift of the first connecting layer relative to the second diode due to a misalignment during fabrication of the diode or due to creep as a result of temperature cycles to which the diode is exposed.

8. The diode arrangement of claim 1, wherein the crystal defects are mechanical micro-cracks.

9. The diode arrangement of claim 1, wherein the first diode is one of a p-n diode, a Schottky diode, an MOS field effect transistor, and an MOS field effect transistor having an electrically connected gate, body region, and source region.

10. The diode arrangement of claim 1, wherein the second diode is implemented as a p-n diode.

11. The diode arrangement of claim 1, wherein the first connecting layer is one of a soldered layer and a sintered layer.

12. The diode arrangement of claim 1, wherein the exposed contact includes a further metal layer.

13. The diode arrangement of claim 12, wherein the further metal layer is implemented as metal strips that extend circumferentially around the middle area and in the edge area.

14. The diode arrangement of claim 1, wherein a lateral distance between the first diode and the second diode is greater than a width of a space charge zone of the diode on an upper side of the plate-shaped semiconductor element.

15. The diode arrangement of claim 1, wherein a lateral extension of the second diode is at least as large as a thickness of the first connecting layer.

16. The diode arrangement of claim 1, wherein a contact metal plating is provided on the first diode in the middle area of the first side, the contact metal plating including a layer sequence of chromium, nickel, and silver.

17. The diode arrangement of claim 1, wherein a dielectric layer is provided on an area between the first diode and the second diode and not over an entirety of a portion of the second diode that is not part of the first diode.

18. The diode arrangement of claim 1, wherein the exposed contact includes a plurality of separate circumferential metal strips in a layer that extends circumferentially around the middle area and over the edge area.

19. The diode arrangement of claim 1, wherein the diode arrangement does not include electrically conductive material arranged in the form of an extension contacting both a top surface of the second diode and a bottom surface of the first metallic contact.

20. The diode arrangement of claim 1, further comprising an electrically insulating material that fills an area from a top surface of the second diode and a bottom surface of the first metallic contact layer.

21. The diode arrangement of claim 1, wherein the first diode is formed by a first p-n junction in the middle area of the first side and the second diode is formed by a second p-n junction in the edge area of the first side.

22. The diode arrangement of claim 21, wherein the diode does not include electrically conductive material arranged in the form of an extension contacting both a top surface of the second diode and a bottom surface of the first metallic contact.

23. The diode arrangement of claim 21, further comprising an electrically insulating material that fills an area from a top surface of the second diode and a bottom surface of the first metallic contact layer.

24. The diode arrangement of claim 1, wherein:
the arrangement of the first metallic contact above the plate-shaped semiconductor element and the second metallic contact below the plate-shaped semiconductor element is in the first direction;
the first diode is formed by a junction of a first doped region and a second doped region;
the second diode is formed by a junction of the second doped region and a third doped region;
at least the portion of the first doped region, at least the portion of the second doped region, and at least the portion of the third doped region are all arranged within each of at least one second plane that extends laterally in a second direction that is perpendicular to the first direction; and
within each of the at least one second plane, the second doped region circumferentially surrounds the first doped region and the third doped region circumferentially surrounds the second doped region.

25. A diode arrangement, comprising:
a plate-shaped semiconductor element;
a first metallic contact arranged above an upper side of the plate-shaped semiconductor element;
a second metallic contact arranged under a lower side of the plate-shaped semiconductor element;
a first connecting layer that extends from at least a portion of the upper surface of the plate-shaped semiconductor element to the first metallic contact; and
a second connecting layer arranged between, and connecting to each other, the lower side of the plate-shaped semiconductor element and the second metallic contact;
wherein:
on the upper side, the plate-shaped semiconductor element includes an electrical contact of a first diode in a middle area of the plate-shaped semiconductor element and an electrical contact of a second diode in an edge area of the plate-shaped semiconductor element, the edge area and the second diode completely encircling the middle area;
a top surface of the electrical contact of the first diode is contacted by the first connecting layer;
at least a part of a top surface of the electrical contact of the second diode is not contacted by the first connecting layer, so that the electrical contact of the second diode is therefore exposed;
the edge area, including the second diode, includes a higher concentration of crystal defects than the middle area including the first diode;
the first metallic contact extends laterally so that it is positioned over both the first diode in the middle area and at least a portion of the second diode in the edge area;
the first connecting layer establishes an electrical connection between the first metallic contact and the electrical contact of the first diode in the middle area; and
the diode arrangement is structured such that a current flow of the diode arrangement responsive to application of a blocking voltage to the diode arrangement is, of the first and second diodes, (a) influencable by only the first diode and not the second diode if the first connecting layer is arranged such that no portion of the first connecting layer contacts the electrical contact of the second diode in the edge area, so that an electrical connection between the first metallic contact and the electrical contact of the second diode is not established independent of the first diode and (b) strongly influencable by the second diode if the first connecting layer contacts the electrical contact of the second diode, so that whether the first connecting layer presently contacts the electrical contact of the second diode is measurable by application of the blocking voltage to the diode arrangement.

26. The diode arrangement of claim 25, further comprising a continuous extension of potting compound directly contacting, at least circumferentially surrounding, and in which are embedded, at least a portion of each of the plate-shaped semiconductor element, the first metallic contact, the first connecting layer, the second metallic contact, and the second connecting layer, with the potting compound directly contacting a top surface of the second diode.

27. The diode arrangement of claim 25, wherein the first connecting layer is arranged entirely below the first metallic contact and entirely above the plate-shaped semiconductor, and, within each of at least one first plane, at least a portion of the first connecting layer extends laterally from (a) over a first position in which a part of the first diode is located and no part of the second diode is located to (b) over a second position in which a part of the second diode is located and no part of the first diode is located.

28. A method of testing an integrity of a diode, wherein:
the diode includes:
   a plate-shaped semiconductor element;
   a first metallic contact arranged above the plate-shaped semiconductor element;
   a first connecting layer that extends from at least a portion of a first side of the plate-shaped semiconductor element to the first metallic contact and via which the first side of the plate-shaped semiconductor element is connected to the first metallic contact;
   a second metallic contact arranged below the plate-shaped semiconductor element; and
   a second connecting layer arranged between a second side of the plate-shaped semiconductor element and the second metallic contact and via which the second side of the plate-shaped semiconductor element is connected to the second metallic contact;
the plate-shaped semiconductor element includes a diode element in a middle area of the first side and a further diode element in an edge area of the first side, the edge area and the further diode completely encircling the middle area;
the edge area, including the further diode element includes a higher concentration of crystal defects than the middle area including the diode element;
the first metallic contact extends laterally so that it is positioned over both the first diode in the middle area and at least a portion of the second diode in the edge area
an electrical connection is established between the first metallic contact and the plate-shaped semiconductor element by an extension of the first connecting layer in a direction from the first metallic contact towards the plate-shaped semiconductor element;
a portion of the first connecting layer is arranged over the diode element; on the first side:
   the further diode element includes a contact that is electrically contactable by the first connecting layer and at least a part of a top surface of which is not contacted by the first connecting layer, so that the contact is therefore exposed; and
   the diode element of the middle area includes a contact, a top surface of which is contacted by the first connecting layer;
the method comprises:
   applying a blocking voltage to the diode;
   measuring a blocking current resulting from the applied blocking voltage to obtain a measured blocking current value; and
   identifying a defect in the diode;
the defect is at least one of a misalignment and a lateral creep of the first connecting layer by which the first connecting layer electrically contacts the further diode element independently of the diode element; and
the identifying of the defect is by determining that the measured blocking current value is above a predefined threshold value.

* * * * *